(12) United States Patent
Chinone et al.

(10) Patent No.: US 9,048,090 B2
(45) Date of Patent: Jun. 2, 2015

(54) SEMICONDUCTOR ELEMENT AND METHOD OF MANUFACTURING SAME

(71) Applicant: STANLEY ELECTRIC CO., LTD., Meguro-ku, Tokyo (JP)

(72) Inventors: Takako Chinone, Tokyo (JP); Mamoru Miyachi, Okegawa (JP); Tatsuma Saito, Yokohama (JP); Takanobu Akagi, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 64 days.

(21) Appl. No.: 13/845,078

(22) Filed: Mar. 17, 2013

(65) Prior Publication Data

US 2013/0241061 A1 Sep. 19, 2013

(30) Foreign Application Priority Data

Mar. 19, 2012 (JP) ................................ 2012-061834

(51) Int. Cl.
| | |
|---|---|
| H01L 21/30 | (2006.01) |
| H01L 21/02 | (2006.01) |
| H01L 29/45 | (2006.01) |
| H01L 23/00 | (2006.01) |
| H01L 33/00 | (2010.01) |
| H01L 33/64 | (2010.01) |

(52) U.S. Cl.
CPC .......... *H01L 21/02425* (2013.01); *H01L 29/45* (2013.01); *H01L 24/29* (2013.01); *H01L 24/32* (2013.01); *H01L 24/83* (2013.01); *H01L 2224/29109* (2013.01); *H01L 2224/29144* (2013.01); *H01L 2224/83193* (2013.01); *H01L 2224/83203* (2013.01); *H01L 2224/83805* (2013.01); *H01L 2924/013* (2013.01); *H01L 2224/29155* (2013.01);

(Continued)

(58) Field of Classification Search
USPC ...................... 257/79, 99; 438/455, 458, 459
See application file for complete search history.

(56) References Cited

U.S. PATENT DOCUMENTS

| | | | |
|---|---|---|---|
| 7,535,092 B2 | 5/2009 | Yokozuka | |
| 8,158,459 B2 * | 4/2012 | Seko | ............................ 438/118 |

(Continued)

FOREIGN PATENT DOCUMENTS

JP 2006-237419 A 9/2006

OTHER PUBLICATIONS

Related U.S. Appl. No. 13/845,072; First Named Inventor: Takako Chinone; Title: "Method of Manufacturing Semiconductor Element"; Filed: Mar. 17, 2013.

*Primary Examiner* — David Vu
*Assistant Examiner* — Brandon Fox
(74) *Attorney, Agent, or Firm* — Holtz, Holtz, Goodman & Chick PC

(57) ABSTRACT

A method of manufacturing a semiconductor element includes forming a first bonding layer containing a metal, which forms a eutectic crystal with Au, on a first substrate to provide a first laminated body. The method also includes forming an element structure layer having a semiconductor layer on a second substrate. The method also includes forming a second bonding layer on the element structure layer to provide a second laminated body. The second bonding layer has a metal underlayer containing a metal, which forms a eutectic crystal with Au. The second bonding layer also has a surface layer that contains Au. The method also includes performing heating pressure-bonding on the first and second laminated bodies with the first and second bonding layers facing each other. The heating temperature of the second substrate in the heating pressure-bonding is higher than the heating temperature of the first substrate.

13 Claims, 6 Drawing Sheets

(52) U.S. Cl.
CPC ............... *H01L 2924/12041* (2013.01); *H01L 2924/01322* (2013.01); *H01L 33/0079* (2013.01); *H01L 33/641* (2013.01)

(56) References Cited

U.S. PATENT DOCUMENTS

| | | | |
|---|---|---|---|
| 8,288,868 B2 * | 10/2012 | Seko | 257/772 |
| 8,405,113 B2 | 3/2013 | Kazama | |
| 2005/0199904 A1 | 9/2005 | Yamamoto | |
| 2008/0135868 A1 | 6/2008 | Okagawa et al. | |
| 2011/0042708 A1 | 2/2011 | Nihei et al. | |
| 2011/0315315 A1 | 12/2011 | Garnier | |
| 2012/0025251 A1 | 2/2012 | Kazama | |
| 2012/0070958 A1 * | 3/2012 | Furukawa et al. | 438/455 |

* cited by examiner

SEMICONDUCTOR ELEMENT AND METHOD OF MANUFACTURING SAME

BACKGROUND OF THE INVENTION

1. Field of the Invention

This invention relates to a semiconductor device such as a light-emitting diode (LED) and also relates to a method of manufacturing such semiconductor element.

2. Description of the Related Art

Light-emitting devices equipped with LED elements are used in, for example, illumination, backlighting and industrial equipment. Efforts are expended to increase the brightness of light-emitting elements in such light-emitting devices. LED elements are manufactured by using, for example, a metal-organic chemical vapor deposition (MOCVD) method to deposit a semiconductor layer of AlGaInP or GaN by epitaxial growth on a GaAs substrate, sapphire substrate or other growth substrate. In an LED element manufactured in this way, light emitted from the light emission layer is absorbed in the growth substrate so that the efficiency of light extraction is reduced. In addition, the efficiency of hear dissipation is poor because of the low thermal conductivity of the growth substrate.

In order to resolve the above-mentioned problems, LED elements are manufactured in the following manner: a semiconductor layer grown on a growth substrate is laminated on a supporting substrate that has high thermal conductivity with a light-reflecting material intervening, and then the growth substrate is removed. Such LED elements are disclosed in, for example, Japanese Patent Application Publication (Kokai) No. 2006-237419.

When semiconductor elements are manufactured using supporting substrates as described above, a eutectic crystal such as AuSn is used to bond the semiconductor layer to a supporting substrate with thermal conductivity. This bonding is referred to as "eutectic bonding" in this specification. In eutectic bonding, the eutectic crystal material is melted or softened at a high temperature at or above the melting point of the AuSn used in bonding, in order to perform satisfactory bonding with few voids in the bond portion.

FIG. 1 of the accompanying drawings shows a scanning electron microscopy (SEM) image (20,000×) of a cross section of a bonding portion after general eutectic bonding is performed. In this SEM image, a layer containing large amounts of Au appears pale and whitish, whereas layers containing large amounts of Sn appear darker and blackish. As shown in FIG. 1, when performing eutectic bonding using AuSn, a layer containing a large amount of Sn (that is, an Sn-rich layer), a layer containing a large amount of Au (that is, an Au-rich layer), and another Sn-rich layer are formed in the bonding portion, in order from the semiconductor layer side, to form a sandwich structure in which an Au-rich layer is sandwiched by two Sn-rich layers. Sn has a low(er) thermal conductivity (64 W/m·K) compared with that of Au (295 W/m·K), and so the layer adjacent to the semiconductor layer has low thermal conductivity. As a result, dispersion of heat from the semiconductor layer is impeded, and the efficiency of heat dissipation is poor.

SUMMARY OP THE INVENTION

One object of this invention is to provide a semiconductor element (e.g., LED) having a thermally conductive supporting substrate with high reliability. Another object of the invention is to provide a method of manufacturing such semiconductor element. The resulting semiconductor element possesses improved heat dissipation because a layer with high thermal conductivity is provided in an area in contact with a semiconductor wafer of the bonding portion between the semiconductor wafer and the thermally conductive supporting substrate.

According to one aspect of the present invention, there is provided a method of manufacturing a semiconductor element that includes forming a first bonding layer comprising a metal which forms a eutectic crystal with Au, on a first substrate to provide a first laminated body (semiconductor wafer). The manufacturing method also includes forming an element structure layer having a semiconductor layer on a second substrate. The manufacturing method also includes forming a metal underlayer comprising a metal which forms a eutectic crystal with Au, on the element structure layer. The manufacturing method also includes forming a surface layer comprising Au on the metal underlayer to provide a second laminated body (supporting substrate). The combination of the underlayer and the surface layer is a second bonding layer. The manufacturing method also includes performing heating pressure-bonding the first and second laminated bodies, with the first and second bonding layers facing each other. The heating temperature of the second substrate in the heating pressure-bonding step is made higher than the heating temperature of the first substrate.

In the bonding portion formed when bonding the semiconductor wafer and the supporting substrate, a layer with high thermal conductivity is formed adjacent to the semiconductor layer which generates heat. Therefore, the efficiency of dissipation of heat from the semiconductor layer is increased, and the reliability of the semiconductor element can be improved.

According to another aspect of the present invention, there is provided a semiconductor element that includes a substrate, and a metal layer made of a metal eutectic crystal formed on the substrate. The semiconductor element also includes an element structure layer formed on the metal layer. The metal layer has an Au-biased area with a higher Au content than other areas of the metal layer, and this Au-rich area is provided on the element structure layer side.

In the bonding portion formed when bonding the semiconductor wafer and the supporting substrate, a layer with high thermal conductivity is formed adjacent to the heat-generating semiconductor layer. Thus, the efficiency of dissipation of heat from the semiconductor layer is enhanced, and the reliability of the semiconductor element can be improved.

These and other objects, aspects and advantages of the present invention will become apparent to those skilled in the art from the following detailed description and claims when read and understood in conjunction with the accompanying drawings.

DETAILED DESCRIPTION OF THE INVENTION

Figure 1:
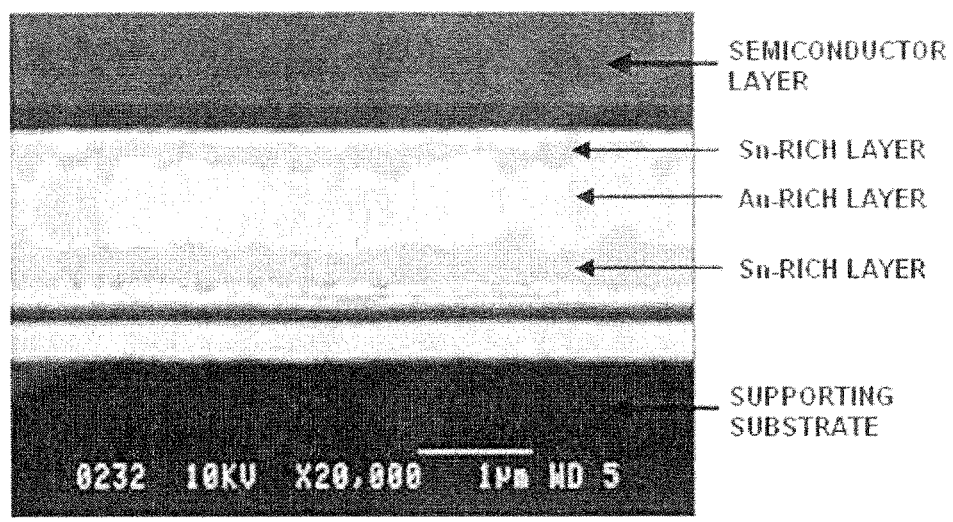
FIG. 1 is a SEM image showing a cross-sectional view of a eutectic bonding portion of the prior art.
Figure 2A:
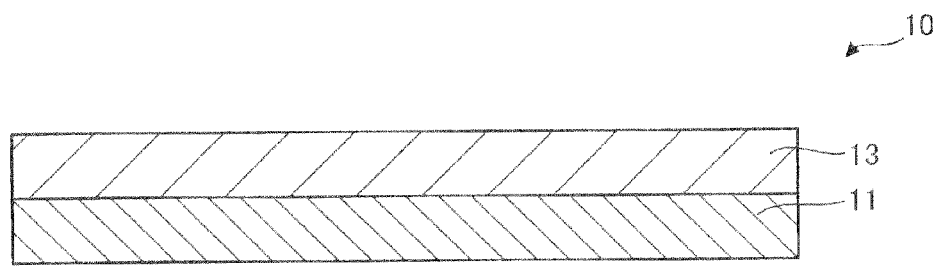
FIG. 2A is a cross-sectional view of a supporting structure to be bonded in an exemplary manufacturing method of the invention.
Figure 2B:
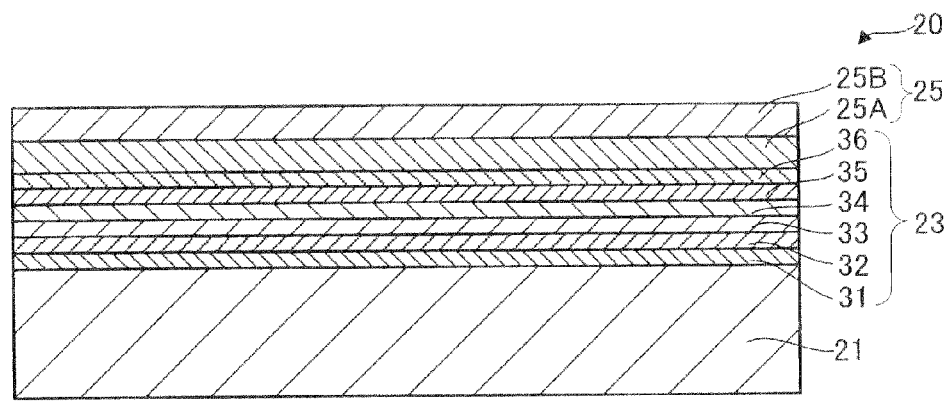
FIG. 2B is a cross-sectional view of a semiconductor wafer to be bonded to the supporting structure shown in FIG. 2A in the exemplary manufacturing method of the invention.
Figure 3:
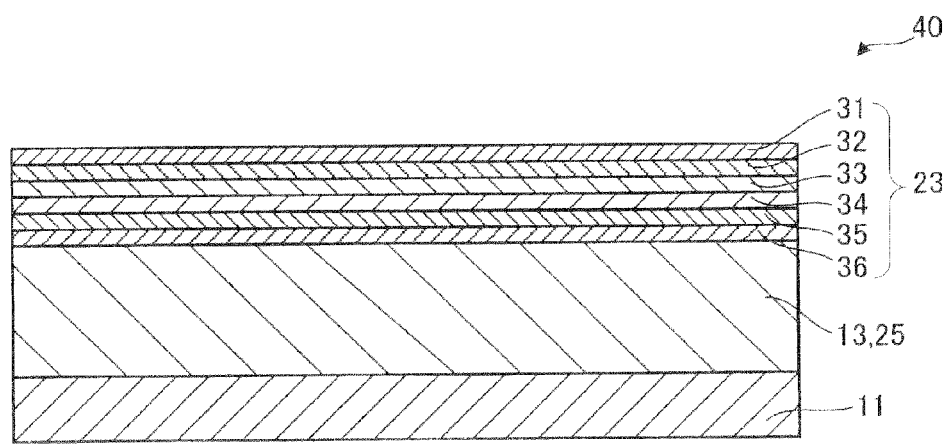
FIG. 3 is a cross-sectional view of an LED element manufactured using the exemplary manufacturing method of the invention.

Referring now to FIG. 2A, FIG. 2B and FIG. 3, a supporting structure, semiconductor wafer, and light-emitting element formed by bonding the supporting substrate to the semiconductor wafer in a method for manufacturing a light-emitting element according to one embodiment of the invention are described. FIG. 2A and FIG. 2B are cross-sectional diagrams of the supporting structure and of the semiconductor wafer respectively. FIG. 3 is a cross-sectional view of the light-emitting element obtained by bonding together the supporting structure and semiconductor wafer.

The supporting structure 10 includes a supporting substrate 11, and a first bonding layer 13 formed on the supporting substrate 11.

The supporting substrate 11 includes a substrate of Si or other suitable material with high thermal conductivity, and Ohmic metal layers (not shown) on both faces of the Si substrate. The Ohmic metal layer includes 200 nm Pt, 150 nm Ti, 50 nm Ni, 100 nm Au and 200 nm Pt, formed in order by evaporation deposition or other suitable method. It should be noted that the supporting substrate 11 may be made from Ge, Al, Cu or another material, so long as the material has high thermal conductivity.

The first bonding layer 13 is formed on the supporting substrate 11, by evaporation deposition to 1000 nm by means of codeposition using a resistive heater, of a metal layer which forms a eutectic crystal with Au by heating and pressure-bonding. The metal layer is for example an AuSn layer whose Sn content is 21 wt %. It should be noted that the Sn content of the AuSn layer need not necessarily be 21 wt %. For example, the Sn content of the AuSn layer is between 18 wt % and 25 wt %. It should also be noted that the first bonding layer may be an AuIn layer. In bonding of the supporting structure 10 and the semiconductor wafer 20 (will be described), it is preferable that the surface of the first bonding layer 13 be made flat, and that the surface of the first bonding layer 13 and the surface of a second bonding layer on the side of the semiconductor wafer 20 (will be described) be made to adhere to facilitate eutectic crystal formation. Hence it is preferable that the layer thickness of the first bonding layer 13 be 50 nm or greater so as to absorb roughness in the surface of the supporting substrate 11.

The semiconductor wafer 20 has a growth substrate 21 which is a sapphire substrate, an element structure layer (device layer) 23 grown on the growth substrate 21, and a second bonding layer 25 formed on the upper face of the element structure layer 23.

A method of growing one element structure layer 23 is described. First, for example an n-type cladding layer (GaN layer) 31 of layer thickness 5.0 µm, a light-emitting layer 32 of layer thickness 75 nm, a p-type barrier layer 33 of layer thickness 40 nm and composition $Al_{0.2}Ga_{0.8}N$, and a p-type cladding layer (GaN layer) 34 of layer thickness 100 nm are epitaxially grown by an MOCVD method on the (001) face of a supporting substrate 11 comprising sapphire having a thickness of 430 µm and a diameter of 2 inches, at growth temperatures of approximately 500° C. (degrees C.) to 1100° C. according to the layer being grown, to form the semiconductor layer. The light-emitting layer may be a multiple quantum well (MQW) layer, a single quantum well (SQW) layer, or a single layer (so-called bulk layer).

A multiple quantum well structure has for example five pairs of well layers and barrier layers, with $In_xGa_{1-x}N$ layers (composition variable x=0.35, thickness 2 nm) as the well layers and GaN layers (thickness 14 nm) as she barrier layers. The In composition variable x of the well layers is adjusted in the range $0 \leq x \leq 1.0$ according to the light emission wavelength.

Next, a reflective electrode layer 35 comprising Ni and Ag is formed on the p cladding layer 34. The reflective electrode layer 35 is formed by deposition in succession on the p-type cladding layer 34, for example using an EB (electron beam or e-beam) evaporation deposition method, of 0.5 nm Ni and 300 nm Ag. It should be noted that other suitable methods than the EB evaporation deposition, method may be used. For example, a resistive heating evaporation deposition method or a sputtering method can be used. When making the reflective electrode layer 35, a resist, mask may be formed on the surface of the reflective electrode layer 35 over regions which are to become light-emitting regions, and using an etchant mixed in the ratio nitric acid 1:water 1:acetic acid 8:phosphoric acid 10, etching may be performed for 20 seconds at 25° C. After that, heat treatment may be performed for 2 minutes at 400° C. in an atmosphere containing oxygen, to form individual light-emitting regions and corresponding regions (i.e., regions corresponding to the respective light-emitting regions).

Finally, in order to prevent, diffusion of Ag of the reflective electrode layer 35, a 100 nm Ti layer and 200 nm Pt layer are formed as a metal diffusion prevention barrier layer 36 on the reflective electrode layer 35.

A second bonding layer 25 is formed on the element structure layer 23. The second bonding layer 25 is a layer used, in bonding with the supporting structure 10 (will be described). The second bonding layer 25 has a eutectic underlayer 25A and a surface layer 25B. The second boding layer 25 is formed by deposition in succession by an EB evaporation deposition method of 300 nm Ni (thermal conductivity 91 W/m·K) as the eutectic underlayer 25A, and 200 nm Au as the surface layer 25B. The eutectic underlayer 25A undergoes eutectic reaction with the Au forming the surface layer 25B in the bonding process (will be described), and serves to retain the Au on the side of the element structure layer 23. Because the Ni of the eutectic underlayer 25A forms a metal layer with high stress, it is preferable that the eutectic underlayer 25A be made 300 nm or less in thickness, so as not to give rise to destruction of the element structure layer and/or growth substrate or to other problems.

If the layer thickness of the surface layer 25B is too thin, in the bonding treatment, nearly the entire region of the Au of the surface layer 25B forms a eutectic crystal with the Ni of the eutectic underlayer 25A. As a result, the region forming a eutectic crystal with the AuSn of the first bonding layer 13 on the side of the supporting structure 10 is reduced in size, so that bonding defects occur between the first bonding layer 13 and the second bonding layer 25. In order to satisfactorily bond the first bonding layer 13 and the second bonding layer 25, the layer thickness of the Au layer forming the surface layer 25B is 50 nm or greater, and preferably 100 nm or greater, and still more preferably 200 nm or greater. It should be noted that the material of the eutectic underlayer 25A may be other metals than Ni so long as affinity is high in the eutectic reaction with the Au of the surface layer 25B. For example, In (thermal conductivity 82 W/m·K) or similar can be used. It is preferable that the eutectic underlayer 25A be a material with a higher thermal conductivity than Au, such as Ni or In. It is preferable that the eutectic underlayer 25A be provided as a single body, such that the heat dissipation primarily takes place in the eutectic crystal.

When bonding the supporting structure 10 and semiconductor wafer 20 (will be described), it is preferable that the surface of the second bonding layer 25 be flat, and that the layer thickness of the second bonding layer 25 be 50 nm or greater so as to absorb the roughness in the surface of the element structure layer 23, to enhance adhesion with the surface of the first bonding layer 13 and facilitate eutectic bonding.

The supporting structure 10 and semiconductor wafer 20 are bonded with the first bonding layer 13 and second bonding layer 25 intervening, and the growth substrate 21 is removed, to obtain the semiconductor element 40 shown in FIG. 3.

Figure 4A:
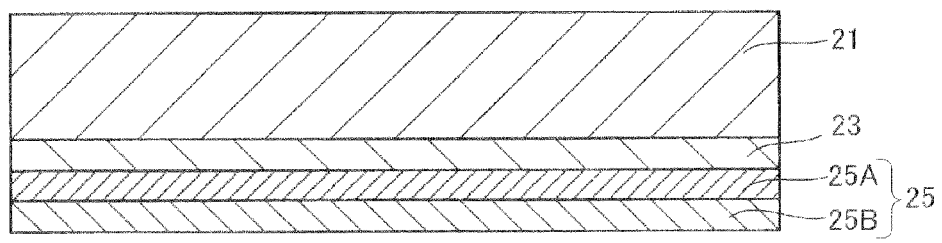
FIG. 4A is a cross-sectional view showing one step in the exemplary manufacturing method of the invention.
Figure 4A:
Figure 4B:
FIG. 4B is a cross-sectional view showing another step in the exemplary manufacturing method of the invention.
Figure 4B:
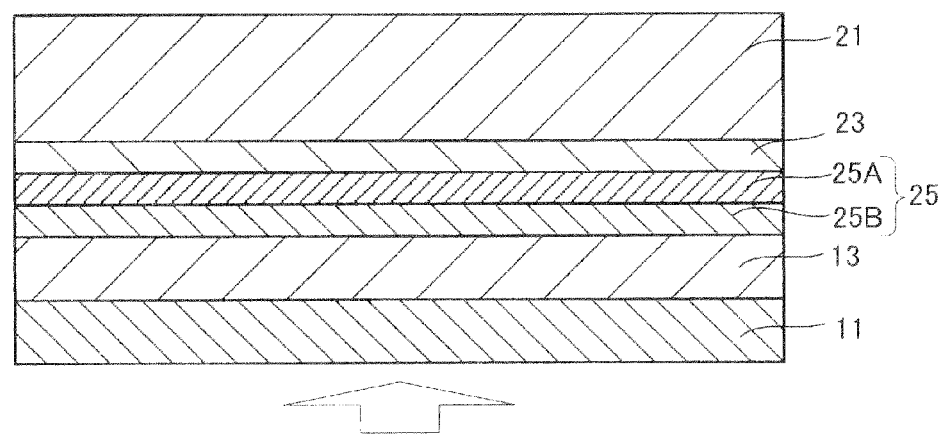
Figure 4C:
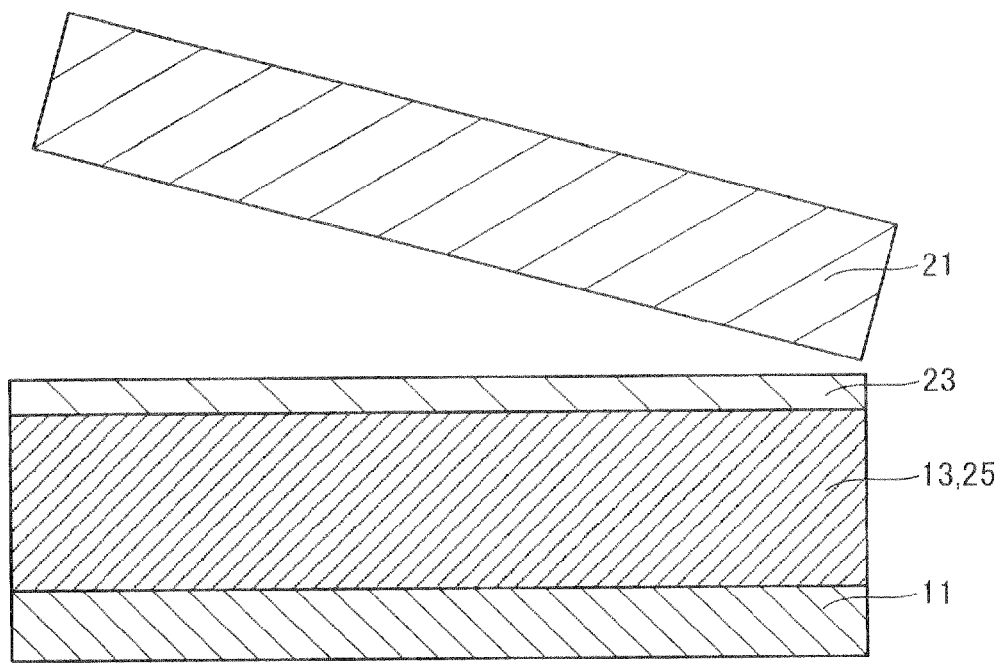
FIG. 4C is a cross-sectional view showing still another step in the exemplary manufacturing method of the invention.
Figure 5:
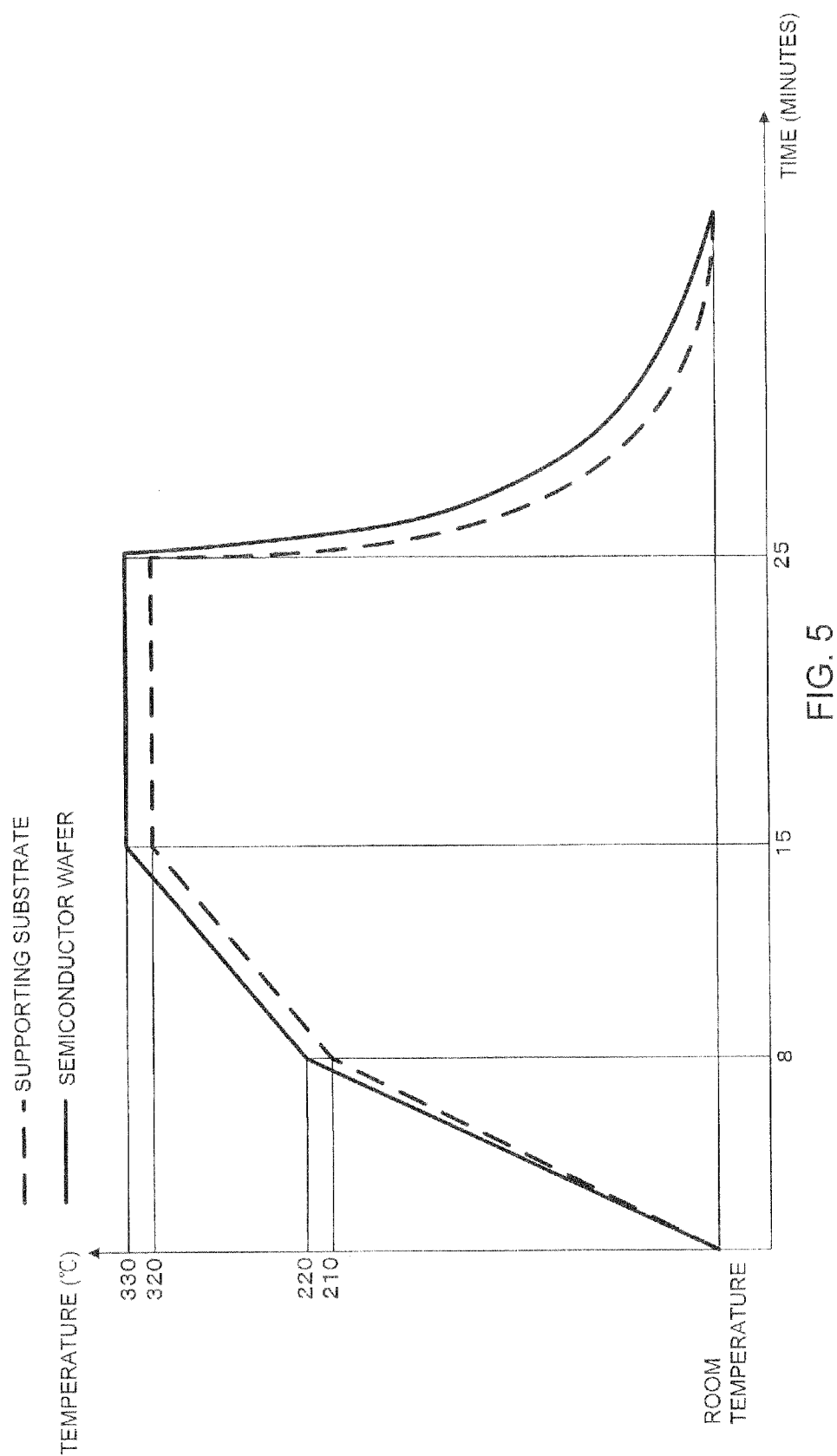
FIG. 5 illustrates temperature profiles during a bonding step in the exemplary manufacturing method of the invention.
Figure 6:
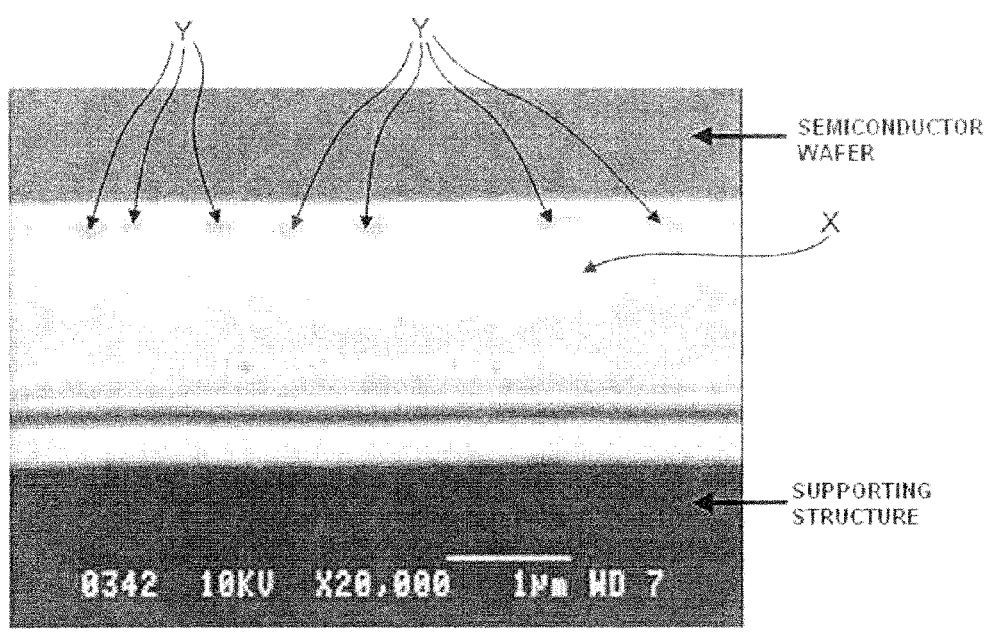
FIG. 6 is an SEM image of a cross section of the bonding portion after heating pressure-bonding is carried out in the exemplary manufacturing method of the invention.

Referring now to FIG. 4A to FIG. 4C, FIG. 5 and FIG. 6, the method of bonding the supporting structure 10 and semiconductor wafer 20 is described. FIG. 4A to FIG. 4C is a series of cross-sectional views of steps for bonding the supporting structure 10 and semiconductor wafer 20 in the method of manufacturing the light-emitting element 40 according to the exemplary embodiment of this invention. FIG. 5 is an example of the temperature profiles during heating when performing bonding. FIG. 6 is a cross-sectional scanning electron microscopy (SEM) image (20,000×) of the bonding portion after the bonding of the supporting structure 10 to the semiconductor wafer 20. It should be noted that in FIG. 4A to FIG. 4C, the detail of the layer structure within the element structure layer 23 is omitted.

First, as shown in FIG. 4A, the supporting structure 10 and semiconductor wafer 20 are disposed such that the respective bonding layers 13 and 25 oppose each other. Next, as shown in FIG. 4B, the supporting structure 10 and semiconductor wafer 20 are heated in a vacuum environment by heaters (not shown) disposed on the respective rear faces (the faces on the sides opposite the bonding faces), the surface of the first bonding layer 13 and the surface of the second bonding layer 25 are brought into contact, and a force of 6 kN is applied in opposite directions (indicated by the unshaded arrows), to perform heating pressure-bonding treatment to form a eutectic crystal between the metals of the bonding layers.

In this heating pressure-bonding treatment, the temperature of the semiconductor wafer 20 is made higher than the temperature of the supporting structure 10 to perform bonding. FIG. 5 shows an example of the heating temperature profiles of the supporting structure 10 and semiconductor wafer 20 in this embodiment. As shown in FIG. 5, in the heating pressure-bonding treatment, the temperature of the semiconductor wafer 20 is set to 330° C. and the temperature of the supporting structure 10 is set to 320° C., and these temperatures are maintained for 10 minutes to form a eutectic crystal. Over substantially the entire rime of this heating treatment, the heating is performed with the two heaters disposed respectively at the rear faces (or back sides) of the semiconductor wafer 20 and supporting structure 10. These heaters are controlled such that the temperature of the semiconductor wafer 20 is approximately 10° C. higher than the temperature of the supporting structure 10.

When the eutectic bending is performed using a bonding layer comprising Au and Sn, the Sn does not diffuse (or move) very much toward a region of comparatively high temperature, but moves toward a region where the temperature is comparatively lower. In this embodiment, an Ni layer (i.e., the eutectic underlayer 25A) is additionally disposed between the Au layer (i.e., the surface layer 25B) of the second bonding layer 25 and the element structure layer 23. The eutectic underlayer 25A is provided to form a eutectic crystal with the surface layer 25B. When performing the eutectic bonding of the supporting structure 10 and semiconductor wafer 20, the neighboring Ni and Au form a eutectic crystal, and therefore the Au is drawn to the side of the semiconductor wafer 20. As a result, the first and second bonding layers are fused by eutectic bonding and become an integrated bonding portion. In this integrated bonding portion, a region of high Au concentration and high thermal conductivity can be created adjacent to the element structure layer 23 of the semiconductor wafer 20.

This pressure-bonding treatment may be performed in a nitrogen atmosphere. The maximum heating temperature which is held constant during the eutectic crystal formation in the bonding process is set such that the temperature of both the supporting structure 10 and the semiconductor wafer 20 is in the range of 230° C. to 350° C., preferably 300° C. or higher in order to perform satisfactory bonding with few voids (300° C. to 350° C.), and preferably 330° C. or lower in order to avoid destruction of the semiconductor wafer 20 and/or supporting structure 10 due to thermal expansion upon returning the temperature to room temperature or in removal of the growth substrate 21 (300° C. to 330° C.). The time over which the maximum temperature is maintained is 5 minutes or more and 60 minutes or less, and preferably is 15 minutes or less in order to prevent degradation of the element structure layer and other parts (5 minutes to 15 minutes). The larger the temperature difference between the supporting structure 10 and the semiconductor wafer 20, the more Sn moves toward the supporting structure 10 and Au moves toward the semiconductor wafer 20 in the bonding portion, so that the Au concentration can be increased in that layer of the bonding portion which is adjacent to the semiconductor wafer 20; but if the temperature difference is made large, warping of the supporting structure 10 and semiconductor wafer 20 when returning the temperature to normal temperature (room temperature) from the bonding temperature becomes large, causing cracks and splits. Thus, it is preferable that the temperature difference be 20° C. or less. However, if the temperature difference is too small, no difference in diffusion movement due to the temperature difference occurs, and so it is preferable that the temperature difference be 5° C. or greater.

It is desirable that nigh force be applied during the heating pressure-bonding in order to cause adhesion of the surface of the first bonding layer 13 with the surface of the second bonding layer 25, but in order to prevent damage to the supporting structure 10 and semiconductor wafer 20, a force in the range of 2.5 kN or higher and 12 kN or lower is preferable.

FIG. 6 shows an SEM image of a cross section of the bonding portion after the pressure-bonding treatment. FIG. 6 shows the result of the above-described heating pressure-bonding treatment. Specifically, the first bonding layer and second bonding layer have fused as a result of interdiffusion, and become a single bonding portion. Within this bonding portion, an Au bias layer X (appearing as the pale, whitish portion in the drawing), which is a layer in which the ratio of Au with high thermal conductivity is biased to the high side as compared with the entirety of the bonding portion, is formed next to the element structure layer 23 on the side of the semiconductor wafer 20. In the Au bias layer X, Sn islands Y (darker, blackish portions in the figure), which are portions in which the Sn ratio is comparatively higher than other portions of the Au bias layer X, exist intermittently with an island morphology. That is, in this bonding portion, a layer is formed adjacent to the element structure layer 23, in which the Au ratio is higher than in other regions and the thermal conductivity is high. The Sn ratio in the entirety of the bonding portion formed by fusion of the first and second bonding layers is 15 wt % to 13 wt %. In the cross-sectional SEM image of FIG. 6, the ratio of the area of the islands Y to the area of she bias layer X is approximately 40%.

In this way, a layer with high thermal conductivity is formed adjacent to the element structure layer 23. Thus, heat, generated from she element structure layer 23 is satisfactorily dissipated, particularly in directions parallel to the upper face of the supporting substrate 11, and the efficiency of dissipation of heat generated from the element structure layer 23 is improved.

After the bonding of the supporting structure 10 to the semiconductor wafer 20, for example a laser liftoff (LLO) device is used to irradiate the growth substrate 21 from the rear face side with an excimer laser to remove the growth substrate 21, as shown in FIG. 4C. It should be noted that the method of removing the growth substrate 21 is not limited to the laser liftoff (LLO) method. For example, wet etching, dry etching, mechanical polishing, chemical-mechanical polishing (CMP), or any combination of two or more of these methods may be used.

After the growth substrate 21 is removed by the LLO method, the Ga generated by the LLO is removed using hot water or other suitable agents, and the exposed surface of the layer 23 resulting from the removal of the substrate 21 is subjected to surface treatment using hydrochloric acid. The reagent (chemical, agent) used in the surface treatment after the LLO method includes any material that can etch a nitride semiconductor. For example, an acid or alkaline solution including phosphoric acid, sulfuric acid, KOH or NaOH may be used. Alternatively, the surface treatment may be performed by dry etching using an Ar plasma or chlorine system plasma, by polishing, or other suitable techniques.

After the surface treatment, an Ohmic electrode (i.e., an n electrode; not shown) is formed on the light extraction face. Specifically, the Ohmic electrode is formed on the n-type cladding layer on (in) the surface of the element structure layer 23 exposed by removal of the growth substrate 21. The Ohmic electrode creates an Ohmic junction with the n-type cladding layer. The n electrode is formed by depositing by evaporation deposition or other suitable methods, in order, Ti 1 nm, Al 200 nm, Ti 100 nm, Pt 200 nm and Au 1000 nm. It should be noted that the n electrode may be formed using any suitable material that can form an Ohmic junction with, an n-type semiconductor. For example, the n electrode may be formed using Al and Rh, or Al and Pt.

The Ohmic electrode may for example be formed using a liftoff method. The deposition method used in the forming of the Ohmic electrode may include a resistive heating evaporation deposition method, an EB evaporation deposition method, sputtering method, or other suitable methods. Further, in order to form a satisfactory Ohmic junction between an n-type cladding layer and an Ohmic electrode on the light extraction face side, alloying by heat treatment at approximately 400° C. in a nitrogen atmosphere may be performed. After passing through the above-described processes, the light-emitting element 40 is completed.

In the method of manufacturing the light-emitting element 40 according to the above-described embodiment, the first bonding layer 13 of the supporting structure 10 is a layer of AuSn, the second bonding layer 25 of the semiconductor wafer 20 is a combination of the eutectic underlayer 25A (Ni layer) and the surface layer 25B (Au layer). In bonding of the supporting structure 10 and semiconductor wafer 20, heating pressure-bonding is performed while holding the temperature of the semiconductor wafer 20 higher than the temperature of the supporting structure 10, to perform eutectic bonding. As a result, a region (layer) with a high Au ratio and high thermal conductivity is formed adjacent to the element structure layer 23. By means of the region (layer) with high thermal conductivity adjacent to the element structure layer 23, heat generated by the element structure layer 23 is promptly dissipated in directions parallel to the upper face of the supporting substrate 11 in particular. Thus, the efficiency of dissipation of heat from the element structure layer 23 is improved, and the reliability of the light-emitting element 40 can be improved.

The above-described embodiment deals with the light-emitting element, but the method of manufacturing of this invention can also be applied to the manufacture of other electronic devices.

The various numerical values, dimensions, materials and similar in the above-described embodiment are merely exemplifications, and can be selected and altered appropriately according to the application, the light-emitting element to be manufactured, and other given conditions.

This application is based on Japanese Patent Application No. 2012-61834 filed on Mar. 19, 2012 and the entire disclosure thereof is incorporated herein by reference.

What is claimed is:

1. A method of manufacturing a semiconductor element, comprising:
   forming a first bonding layer comprising a metal which forms a eutectic crystal with Au, on a first substrate to provide a first laminated body;
   forming an element structure layer including a semiconductor layer on a second substrate;
   forming a second bonding layer comprising Au on the element structure layer to provide a second laminated body; and
   performing heating pressure-bonding on the first and second laminated bodies, with the first and second bonding layers facing each other,
   wherein a heating temperature of the second substrate in said heating pressure-bonding is made higher than a heating temperature of the first substrate, and
   wherein in said heating pressure-bonding, eutectic crystal formation is performed with a temperature difference between the temperature of the second substrate and the temperature of the first substrate maintained in a range of from 5° C. to 20° C.

2. The method of manufacturing a semiconductor element according to claim 1, wherein said forming the second bonding layer includes forming a metal underlayer and a surface layer on the metal underlayer, and the metal underlayer comprises a metal which forms a eutectic crystal with Au, and the surface layer comprises Au.

3. The method of manufacturing a semiconductor element according to claim 2, wherein the metal underlayer comprises Ni or In.

4. The method of manufacturing a semiconductor element according to claim 1, wherein the first bonding layer comprises AuSn or AuIn.

5. The method of manufacturing a semiconductor element according to claim 1, wherein an Sn content of the first bonding layer is between 18 wt % and 25 wt %.

6. The method of manufacturing a semiconductor element according to claim 1, wherein the first substrate includes a substrate having a high thermal conductivity and an Ohmic metal layer.

7. The method of manufacturing a semiconductor element according to claim 1, wherein the first bonding layer has a thickness of 50 nm or more.

8. The method of manufacturing a semiconductor element according to claim 1, wherein the metal underlayer has a thickness of 300 nm or less.

9. The method of manufacturing a semiconductor element according to claim 1, wherein said heating pressure-bonding is carried out in a vacuum environment or a nitrogen atmosphere, with a force of between 2.5 kN and 12 kN being applied on the first and second laminated bodies in opposite directions.

10. The method of manufacturing a semiconductor element according to claim 1, wherein the first laminated body is heated to 280-350° C. and the second laminated body is heated to 280-350° C. in said heating pressure-bonding, and a temperature of the second laminated body is higher than a temperature of the first laminated body, and a temperature difference therebetween is 30° C. or less.

11. A semiconductor element comprising:

a substrate;

a metal layer formed of a metal eutectic crystal formed on the substrate; and an element structure layer formed on the metal layer, wherein the metal layer has an Au bias layer formed with a higher Au content than other portions of the metal layer, and biased on the element structure layer side, and wherein regions with a higher Sn ratio or a higher In ratio than other portions of the Au bias layer exist within the Au bias layer intermittently with an island morphology.

12. The semiconductor element according to claim 11, wherein the substrate includes a substrate having a high thermal conductivity and an Ohmic metal layer.

13. A method of manufacturing a semiconductor element, comprising:

forming a first bonding layer comprising a metal which forms a eutectic crystal with Au, on a first substrate to provide a first laminated body;

forming an element structure layer including a semiconductor layer on a second substrate;

forming a second bonding layer comprising Au on the element structure layer to provide a second laminated body; and performing heating pressure-bonding on the first and second laminated bodies, with the first and second bonding layers facing each other, wherein a heating temperature of the second substrate in said heating pressure-bonding is made higher than a heating temperature of the first substrate, and wherein the first laminated body is heated to 280-350° C. and the second laminated body is heated to 280-350° C. in said heating pressure-bonding, and a temperature of the second laminated body is higher than a temperature of the first laminated body, and a temperature difference therebetween is 30° C. or less.

* * * * *